United States Patent [19]

Johnson et al.

[11] Patent Number: 4,555,157

[45] Date of Patent: Nov. 26, 1985

[54] ELECTRICAL CONNECTOR FOR VISUAL DISPLAY AND METHOD OF MAKING SAME

[75] Inventors: Donald L. Johnson, Olivenhain; Thomas F. Kordis, Solana Beach, both of Calif.

[73] Assignee: Teledyne Industries, Inc., Los Angeles, Calif.

[21] Appl. No.: 647,118

[22] Filed: Sep. 4, 1984

Related U.S. Application Data

[63] Continuation of Ser. No. 410,938, Aug. 24, 1982, abandoned.

[51] Int. Cl.[4] ........................ H05K 1/00; H01R 13/62

[52] U.S. Cl. ........................ 339/75 MP; 339/17 CF; 29/834; 29/842; 29/845

[58] Field of Search ................ 29/832, 834, 842, 844, 29/845; 339/17 CF, 75 M, 75 MP, 176 M, 176 MP

[56] References Cited

U.S. PATENT DOCUMENTS

| | | | |
|---|---|---|---|
| 3,500,295 | 3/1970 | Kaber et al. | 339/176 M |
| 3,951,495 | 4/1976 | Donaher et al. | 339/17 CF |
| 4,012,117 | 3/1977 | Lazzery | 339/176 MP |
| 4,109,993 | 8/1978 | Bauerle | 339/176 M |
| 4,166,665 | 9/1979 | Cutchaw | 339/17 CF |
| 4,194,800 | 3/1980 | Chow | 339/17 CF |
| 4,349,238 | 9/1982 | Showman et al. | 339/17 CF |
| 4,357,061 | 11/1982 | Crosby | 339/75 MP |
| 4,376,562 | 3/1983 | Kaley | 339/17 CF |
| 4,395,084 | 7/1983 | Conrad | 339/17 CF |
| 4,397,510 | 8/1983 | Asada et al. | 339/75 MP |

*Primary Examiner*—Gil Weidenfeld
*Assistant Examiner*—Gary F. Paumen
*Attorney, Agent, or Firm*—Reagin & King

[57] ABSTRACT

An electrical connector is disclosed for making electrical connections to a large area visual display in the form of a substrate having a plurality of spaced-apart contact pads arranged in parallel rows along the edges on one surface. The connector includes a base in the form of a rectangular frame for supporting the edges of the substrate, and having spaced-apart parallel rows of cavities formed in each side of the base. A plurality of contact assemblies each containing a row of electrical contacts are provided which are designed to fit within a respective one of the cavities. A cover is also provided which fits over one side of the substrate and fastens to the base in a manner which applies pressure to the substrate edges to maintain connection between the contact pads and the contacts. The connector includes alignment elements for positioning the substrate so that the contact pads are aligned with the contacts.

12 Claims, 15 Drawing Figures

FIG. 5
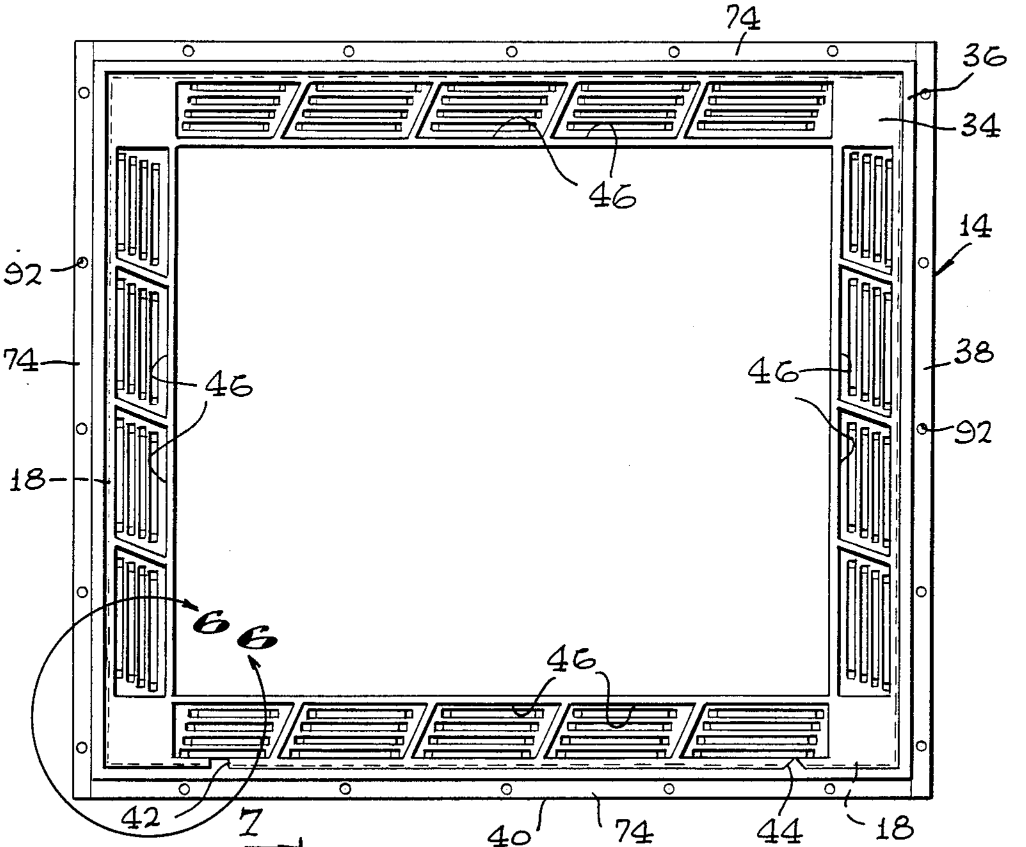
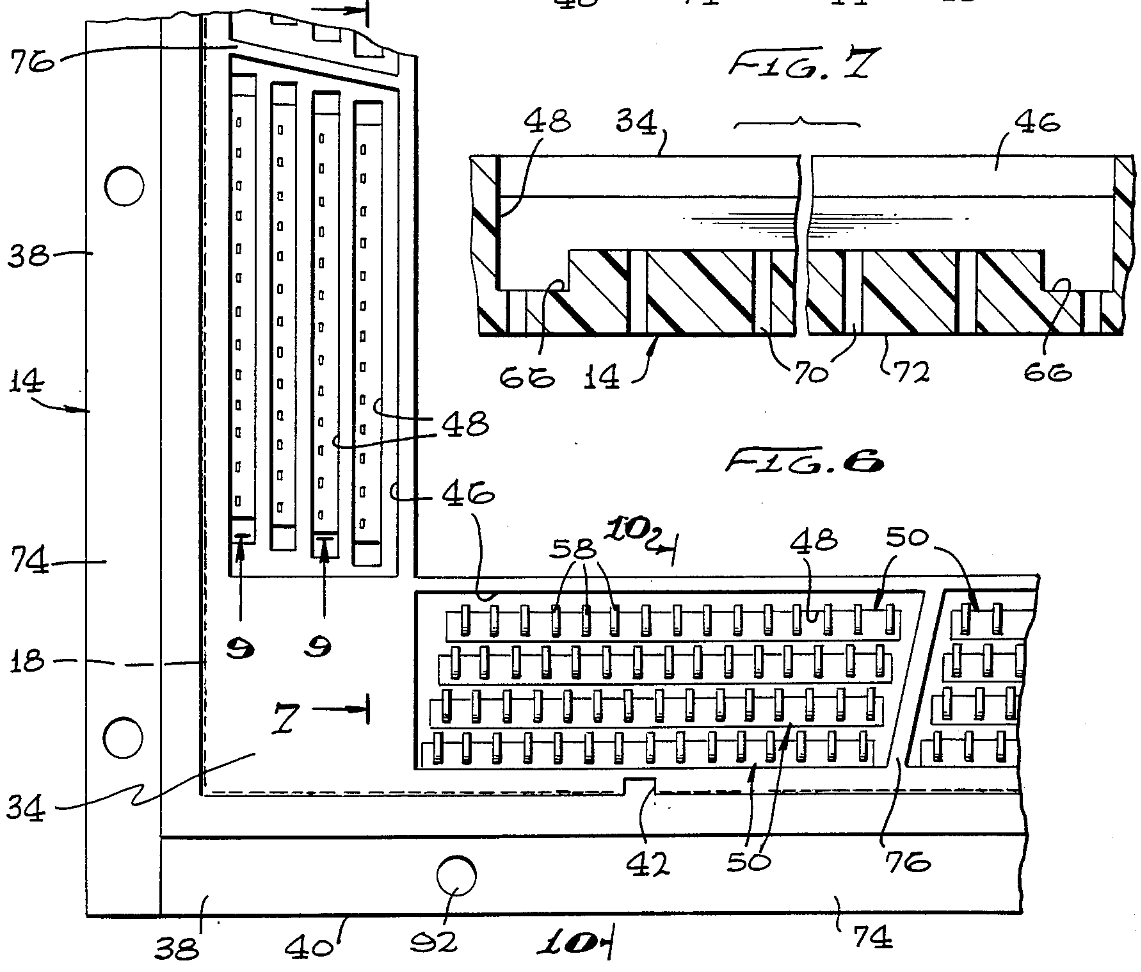
FIG. 6
FIG. 7

FIG. 11
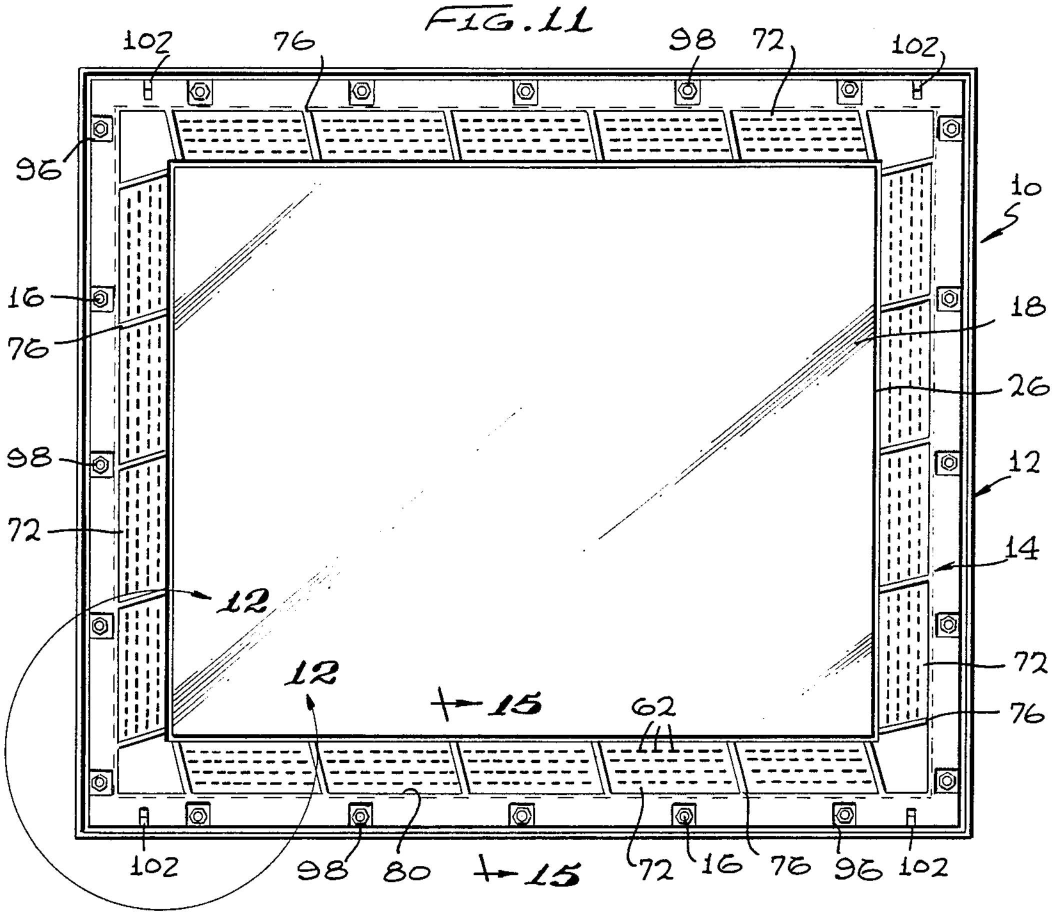
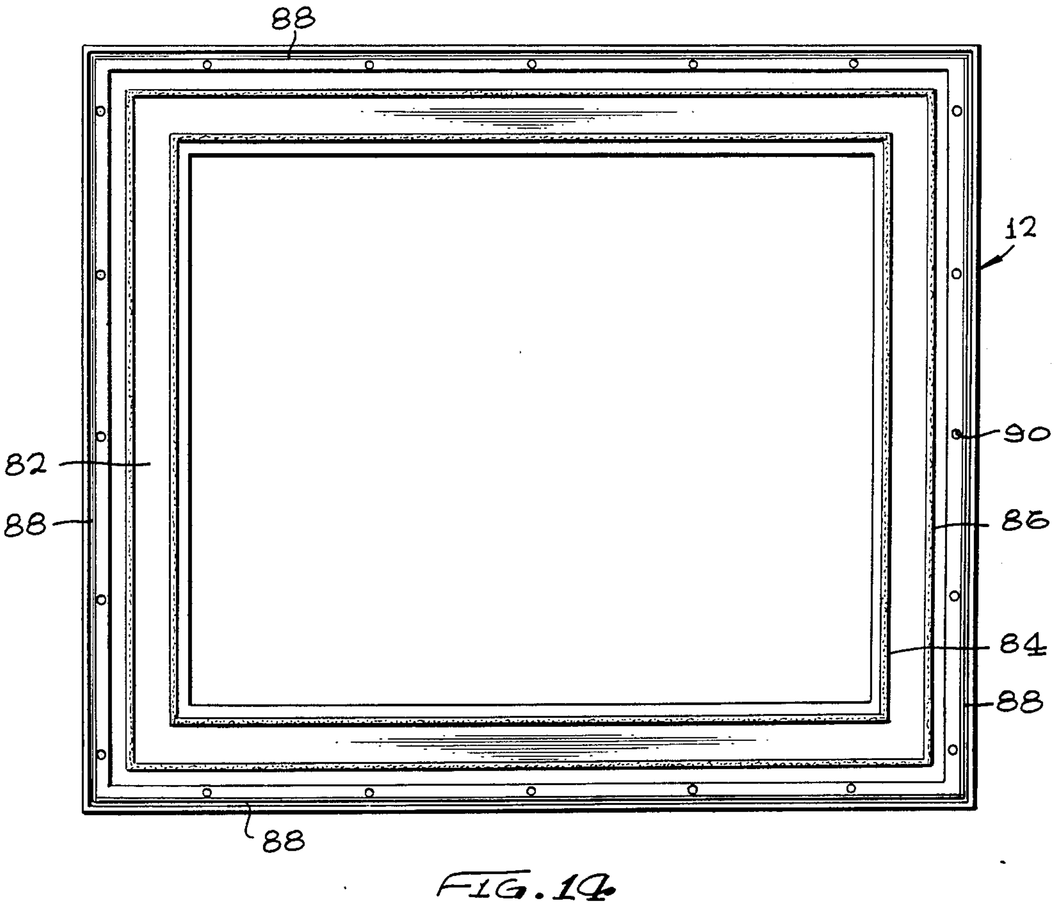
FIG. 14

ELECTRICAL CONNECTOR FOR VISUAL DISPLAY AND METHOD OF MAKING SAME

This is a continuation of co-pending application Ser. No. 410,938, filed on 8/24/82, now abandoned.

BACKGROUND OF THE INVENTION

This invention relates to electrical connectors and, more particularly, to a frame type electrical connector for making electrical connections to large-area visual displays.

Recent advances in display technology have resulted in the development of flat large-area visual displays which create a visual image using a matrix of dots in a manner similar to that used in a cathode ray tube (CRT). One example of such a display is a flat glass substrate having a display area of about one square foot. The substrate includes thin closely-spaced lines of metallization which extend horizontally and vertically across the display area to form a matrix of points or dots where the individual lines cross. A visual image is created by causing various of the points of the display to become visible by applying a voltage between particular ones of the horizontal and vertical lines of metallization. In one embodiment of a flat visual display, 512 horizontal and 640 vertical lines are employed to create a matrix of over 300,000 points.

In order to make practical use of flat visual displays, it is necessary to provide an inexpensive and reliable way of making electrical connections to each of the lines of metallization. In particular, the close spacing between adjacent lines (which may be as little as twenty thousandths of an inch) and the long distance over which these lines are distributed (which may be twelve inches or more) require a connector in which the alignment between the metallization pattern on the display and the individual contacts on the connector is extremely accurate.

Accordingly, it is an object of the present invention to provide a new and improved electrical connector for large-area visual displays.

It is another object of the present invention to provide extremely accurate alignment between a metallization pattern on a large-area visual display and the individual contacts of an electrical connector.

It is a further object of the present invention to provide an inexpensive and reliable method of making an electrical connector for large-area visual displays.

SUMMARY OF THE INVENTION

The foregoing and other objects of the invention are accomplished by an electrical connector designed to make electrical connections to a flat visual display in the form of a generally rectangular large-area substrate having a plurality of spaced-apart contact pads arranged in parallel rows along each edge on one surface of the substrate. The contact pads are accurately positioned with respect to index recesses provided on a first end of the substrate.

The connector includes a base in the form of a generally rectangular frame each side of which includes a support surface for supporting a respective edge on the one surface of the substrate. The base also includes index projections extending above the support surface on a first side of the base and designed to mate with the corresponding index recesses on the first end of the substrate when the substrate is placed onto the base. Parallel rows of spaced apart cavities are formed below the support surface along each side of the base. Each cavity includes alignment recesses accurately positioned with respect to the base index projections.

A plurality of generally rectangular contact assemblies are provided each including spaced-apart, electrically conductive elements. These elements are shaped to provide a row of resilient electrical contacts which project from a first surface of the assembly, and a row of corresponding electrical terminals which project from a second surface of the assembly. The conductive elements in each assembly are accurately positioned with respect to alignment projections provided as part of each assembly.

Each contact assembly is designed to fit within a respective one of the cavities so that the electrical contacts extend in multiple rows adjacent the support surface on each side of the base. When the assemblies are inserted in the respective cavities, the alignment projections engage within the alignment recesses so that the electrical contacts are accurately positioned with respect to the base index projections. Accordingly, when the substrate is placed onto the base, the substrate contact pads are accurately aligned with the electrical contacts.

A cover is provided in the form of a generally rectangular frame designed to fit over the edges on the other side of the substrate and to fasten to the base. The cover includes a resilient element for applying pressure to the edges on the other surface of the substrate to maintain connection between the contact pads and the electrical contacts.

Other objects and advantages of the invention will become apparent by reference to the specification taken in conjunction with the drawings in which like reference numerals refer to like elements in the various views.

BRIEF DESCRIPTION OF THE DRAWINGS

FIG. 5 is a front view of the base portion of the connector of FIG. 1;

FIG. 6 is a front detail view of a section of the base portion taken in the area designated 6—6 in FIG. 5 showing some of the contact assemblies installed within the cavities of the base;

FIG. 7 is an enlarged cross-sectional view of one cavity of the base portion taken along the line 7—7 of FIG. 6;

FIG. 11 is a rear view of the assembled connector of FIG. 1;

FIG. 14 is a rear view of a cover portion of the connector of the present invention.

DESCRIPTION OF THE PREFERRED EMBODIMENT

Figure 1:
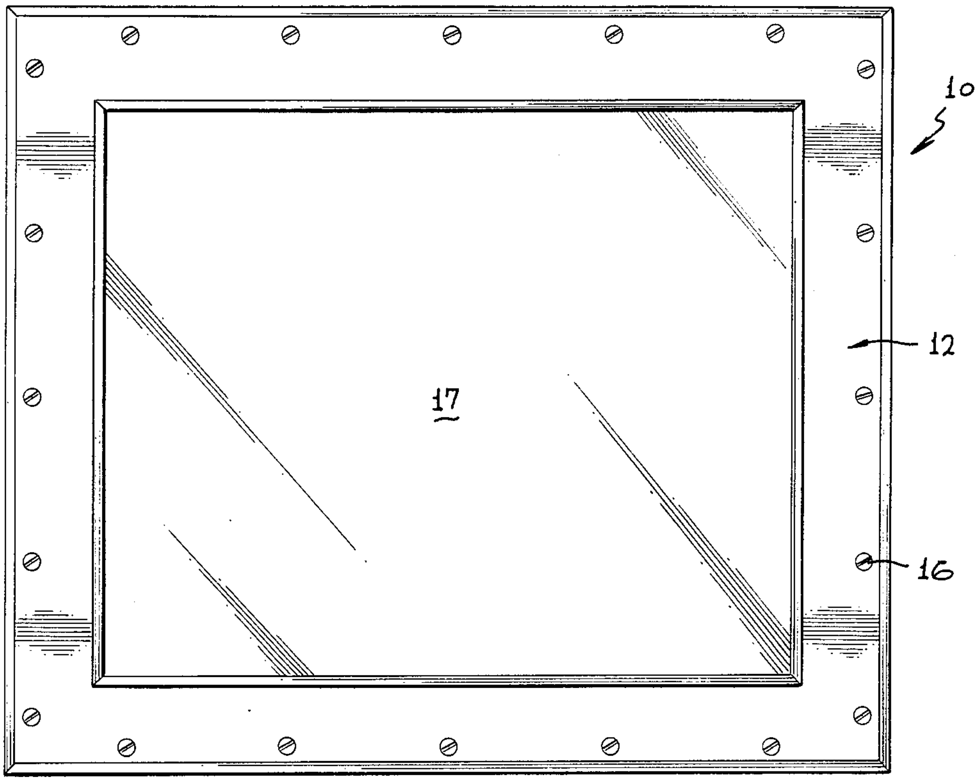
FIG. 1 is a front view of an assembled connector made in accordance with the present invention.
Figure 2:
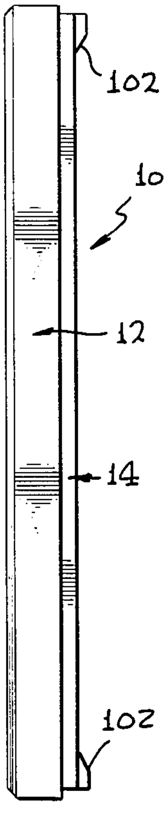
FIG. 2 is a side view of the connector of FIG. 1.

In FIGS. 1 and 2 are shown front and side views, respectively, of the connector 10 of the present invention. The connector 10 includes a cover portion 12 in the form of a generally rectangular frame which is fastened to a base portion 14 using bolts 16. Positioned between the cover 12 and the base 14 is a flat visual display 17 which in a preferred embodiment is in the form of a generally rectangular glass substrate 18.

Figure 3:
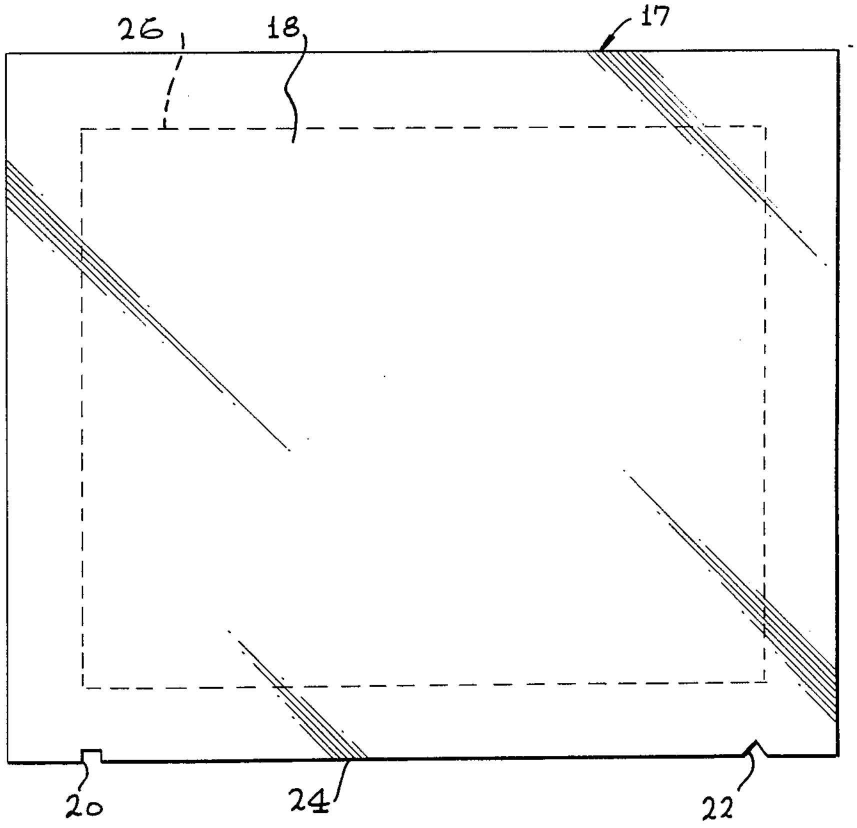
FIG. 3 is a front view of a flat visual display for use with the connector of FIG. 1.

FIG. 3 is a front view of the display 17 which includes indexing recesses 20 and 22 formed within a first end 24 of the substrate 18. As described below, the recesses 20 and 22 are used to accurately position the substrate 18 within the connector 10. A second glass substrate 26 is affixed to the rear surface of the substrate 18 (better shown in FIG. 10) and defines the viewing area of the display 17.

Figure 4:
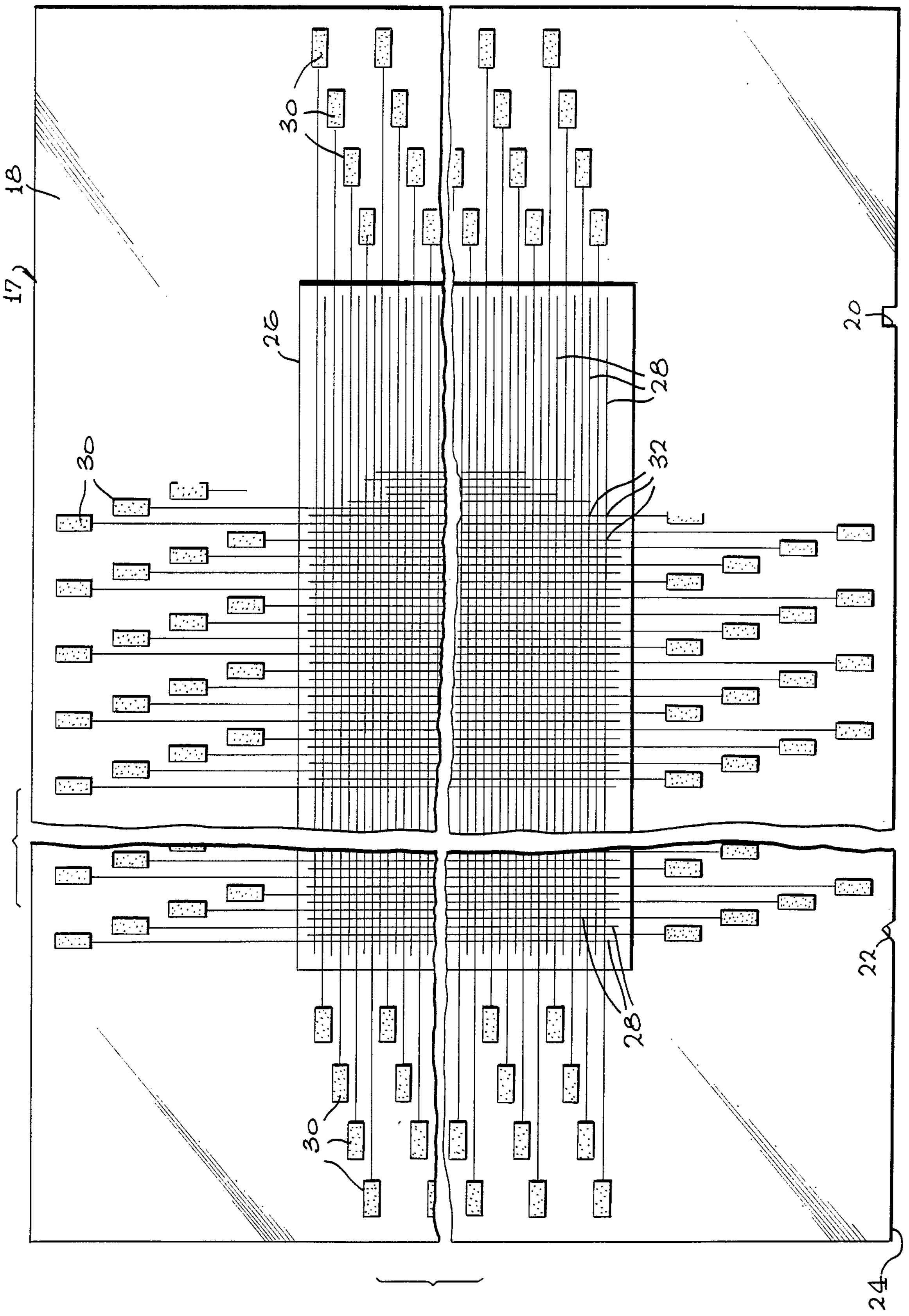
FIG. 4 is a fragmented rear view of the display of FIG. 3 showing the layout of metallization lines and contact pads.

A metallization pattern is formed on the rear surface of the substrate 18 as shown in FIG. 4. The pattern includes a plurality of thin lines 28 extending horizontally and vertically across the rear surface of the substrate 18 to form a matrix of points 32 where the individual lines 28 cross. One end of each line 28 is terminated in a contact pad 30. As shown in FIG. 4, the pads 30 along any one of the edges of the substrate 18 are connected to alternate lines 28. The contact pads 30 are arranged in four parallel rows along the edges of the substrate 18 outside of the viewing area defined by the substrate 26. Each row includes equally spaced pads 30 which are positioned in staggered relationship to the pads 30 of the adjacent row. This arrangement of multiple staggered rows of pads 30 provides a large number of contact pads in a small area.

The entire metallization pattern comprising the lines 28 and the pads 30 is applied to the rear surface of the substrate 18 using a technique such as silk screening. The metallization pattern is positioned on the substrate 18 using the indexing recesses 20 and 22 as position alignment references so that the contact pads 30 are accurately positioned with respect to the recesses 20 and 22.

The visual display 17 may be of the liquid crystal type in which instance suitable liquid crystal materials are enclosed between the substrates 18 and 26. Alternatively, the display 17 may be of the gas discharge type in which instance suitable gases are enclosed between the substrates 18 and 26. In either instance, the display 17 is used to create a visual image by causing various of the points 32 to become visible. This is accomplished by applying a voltage between particular ones of the horizontal and vertical lines 28. The connector 10 of the present invention is used to make electrical connections to the contact pads 30 on the substrate 18.

A typical visual display 17 for use with the connector 10 of the present invention includes a substrate 18 having horizontal and vertical dimensions of fifteen inches and twelve and one half inches, respectively. The metallization pattern on the rear surface of the substrate 18 includes 512 horizontal lines and 640 vertical lines. The spacing between adjacent lines is twenty thousandths of an inch. Since alternate lines are terminated in contact pads 30 positioned on opposite edges of the substrate 18, there are 320 contact pads 30 along each of the horizontal edges and 256 contact pads 30 along each of the vertical edges of the substrate 18 for a total of 1,152 contact pads 30. The spacing between adjacent pads 30 in any one of the rows of pads is one hundred and sixty thousandths of an inch, and each row is staggered forty thousandths of an inch with respect to the adjacent row.

While the typical display 17 described above is used to illustrate a preferred embodiment of the invention, the connector of the present invention is by no means limited to use with this display. As will be apparent to those skilled in the art from a reading of this specification, the connector of the present invention may be easily modified to accommodate a wide variety of displays.

FIG. 5 is a front view of the base portion 14 of the connector 10, and FIG. 6 is a detail view of a section of the base 14 designated 6—6 in FIG. 5. Referring to these two figures, the base 14 is in the shape of a generally rectangular frame formed of a moldable insulating material having a low coefficient of thermal expansion, such as phenolic. The base 14 includes a support surface 34 designed to support the edges on the rear surface of the substrate 18. Surrounding the support surface 34 is a ridge 36 which is in turn surrounded by a cover mounting platform 38. The relative elevations of the various surfaces are shown in FIG. 10 which is an enlarged cross-sectional view of a first side 40 of the base 14 taken along the line 10—10 of FIG. 6.

Figure 10:
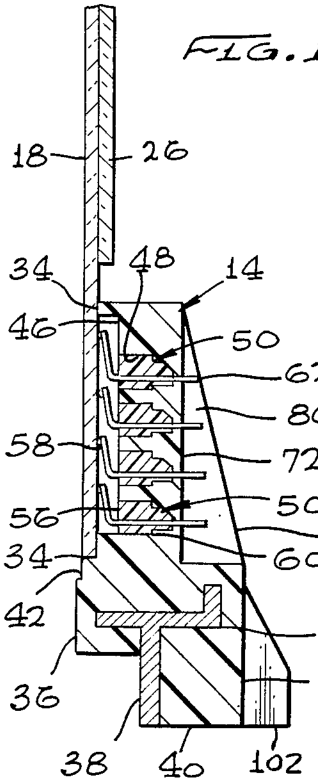
FIG. 10 is an enlarged cross-section view of one side of the base portion taken along the line 10—10 of FIG. 6 showing contact assemblies installed in the cavities and showing the position of the flat visual display of FIG. 3 when it is installed in the connector of the present invention.

Indexing projections 42 and 44 are provided which extend from the ridge 36 above the support surface 34 on the side 40 of the base 14 (see also FIG. 10). The projections 42 and 44 are designed to mate with the indexing recesses 20 and 22 of the substrate 18 when the display 17 is placed on the base 14. The dotted lines in FIGS. 5 and 6 represent the outline of the substrate 18 when it is positioned on the base 14. It should be noted that the base 14 is designed so that the ends of the substrate 18 do not contact the ridge 36. By allowing a space between the ends of the substrate 18 and the ridge 36, the base 14 is able to accommodate substrates 18 which vary from one another in overall dimensions of length and width. This design of the base 14 thus eliminates the need to accurately control the outside dimensions of the glass substrate 18 which is a time consuming and costly process.

From the above discussion, it can be seen that the horizontal and vertical positioning of the substrate 18 with respect to the base 18 is controlled by the projections 42 and 44 in cooperation with the recesses 20 and 22. Since, as described above, the contact pads 30 on the substrate 18 are accurately positioned with respect to the recesses 20 and 22 the projections 42 and 44 act to achieve precise registration of the pads 30 with respect to the base 14.

Figure 8:
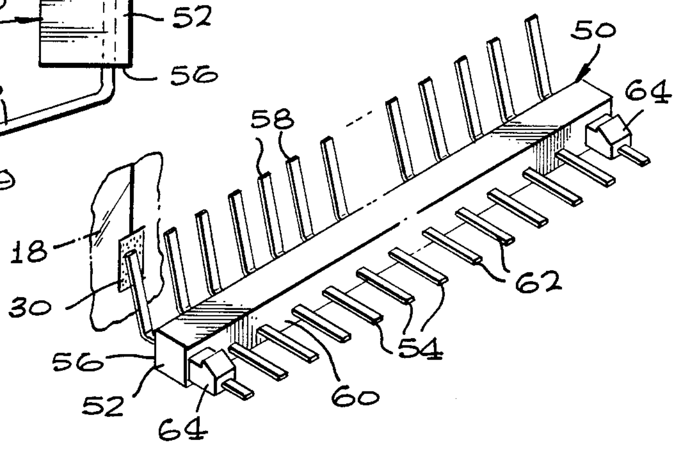
FIG. 8 is a perspective view of a contact assembly used in the connector of FIG. 1.

A plurality of generally rhomboidal-shaped recesses 46 are provided within each side of the base 14 below the surface 34. In the preferred embodiment, five such recesses 46 are provided in spaced-apart relationship along each of the horizontal sides of the base 14, and four recesses 46 are provided in spaced-apart relationship along each of the vertical sides of the base 14. Within each recess 46 are formed four spaced-apart, parallel cavities 48 as shown in FIGS. 6 and 10. Each cavity 48 is offset in position with respect to the adjacent cavity 48 within each recess 46 and each cavity 48 is designed to receive a contact assembly 50 which is shown in perspective view in FIG. 8.

Figure 9:
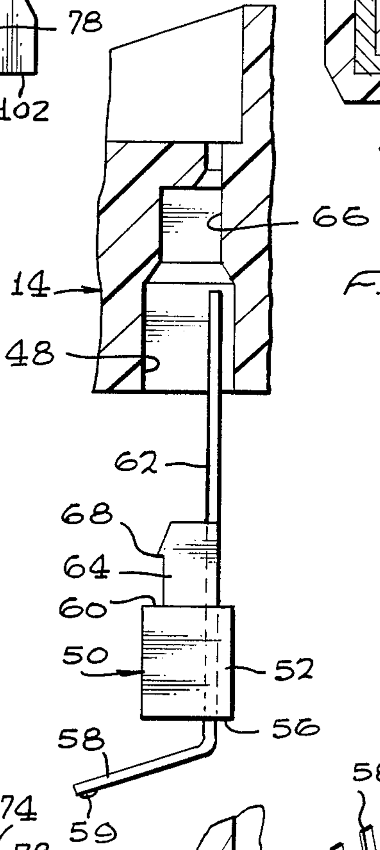
FIG. 9 is an enlarged cross-sectional view of one cavity of the base portion taken along the line 9—9 of FIG. 6 showing a contact assembly being inserted into the cavity.

The contact assembly 50 includes a generally rectangular body 52 formed of a moldable plastic material such as Valox. Molded within the body 52 are a plurality of spaced-apart electrically conductive elements 54 made of a resilient material such as aluminum-bronze alloy. The portion of each element 54 which extends from a front surface 56 of the body 50 is shaped to provide a resilient electrical contact 58 which is used to make electrical connection to a respective pad 30 on the substrate 18 in the manner described below. A sharp projection 59 may be formed at the end of each contact 58 as shown in FIG. 9 to provide high pressure contact to the pad 30. The portion of each element 54 which extends from a rear surface 60 of the body 52 forms an electrical terminal 62 which may be connected to an external electrical cable using techniques such as soldering, wire-wrapping, or the like. Projecting from the bottom surface 60 at each end of the body 52 is an alignment boss 64. The assembly 50 is constructed so that the elements 54 are accurately positioned within the body 52 with respect to the bosses 64. The spacing between adjacent elements 54 is equal to the spacing between adjacent contact pads 30 in any one row of pads. In the preferred embodiment, each contact assembly 50 contains sixteen conductive elements 54.

Each of the cavities 48 within the sides of the base 14 is shaped as shown in the cross-sectional views of FIGS. 7 and 9 to receive in plug-in fashion a contact assembly 50. The cavity 48 includes alignment recesses 66 into which the alignment bosses 64 engage. The recesses 66 are accurately positioned within the base 14 with respect to the indexing projections 42 and 44. A sharp projecting edge 68 is provided on each boss 64 to lock the assembly 50 in place within the cavity 48. Openings 70 are provided between the cavity 48 and a rear surface 72 of the base 14 to provide clearance for the terminals 62.

When the assemblies 50 are inserted within the respective cavities 48, the contacts 58 extend in multiple rows along each side of the base 14 and form a staggered arrangement as typified in the view of the horizontal side 40 of the base 14 shown in FIG. 6. Referring to FIG. 10, the top surface 56 of each installed assembly 50 lies generally flush with the rear surface of the recess 46, and the terminals 62 project beyond the rear surface 72 of the base 14. The staggered arrangement of the contacts 58 along each side of the base 14 is designed to correspond to the staggered arrangement of contact pads 50 along each edge of the substrate 18.

The cover mounting platform 38 which surrounds the ridge 36 of the base 14 is formed by one surface of four generally T-shaped metal base stiffening bars 74 one of which is shown in cross-section in FIG. 10. Each bar 74 is molded in place along a respective side of the base 14 and each extends substantially the length of the respective side as shown in FIG. 5. One purpose of the bars 74 is to prevent the sides of the base 14 from bending when the cover 12 is fastened to the base 14 as discussed in detail below. Thus it is necessary that the material used to make the bars 74 be sufficiently stiff to resist the forces tending to bend the base 14. In the preferred embodiment, the bars 74 are formed of extruded aluminum. It should be noted that while the preferred embodiment employs four individual stiffening bars 74, an alternate embodiment may be constructed in which the bars 74 are formed as a single rectangular metal frame using material such as cast aluminum.

Referring to FIGS. 5, 6, and 10, the areas between adjacent recesses 46 along each side of the base 14 are formed to provide base stiffening ribs 76 which extend from the support surface 34 to a rear surface 78 of the base 14. The ribs 76 are generally triangular-shaped walls between adjacent ones of which are formed recesses 80 into which the terminals 62 project. The ribs 76 act to strengthen the sides of the base 14 to resist forces which act to bend the sides of the base 14.

Figure 12:
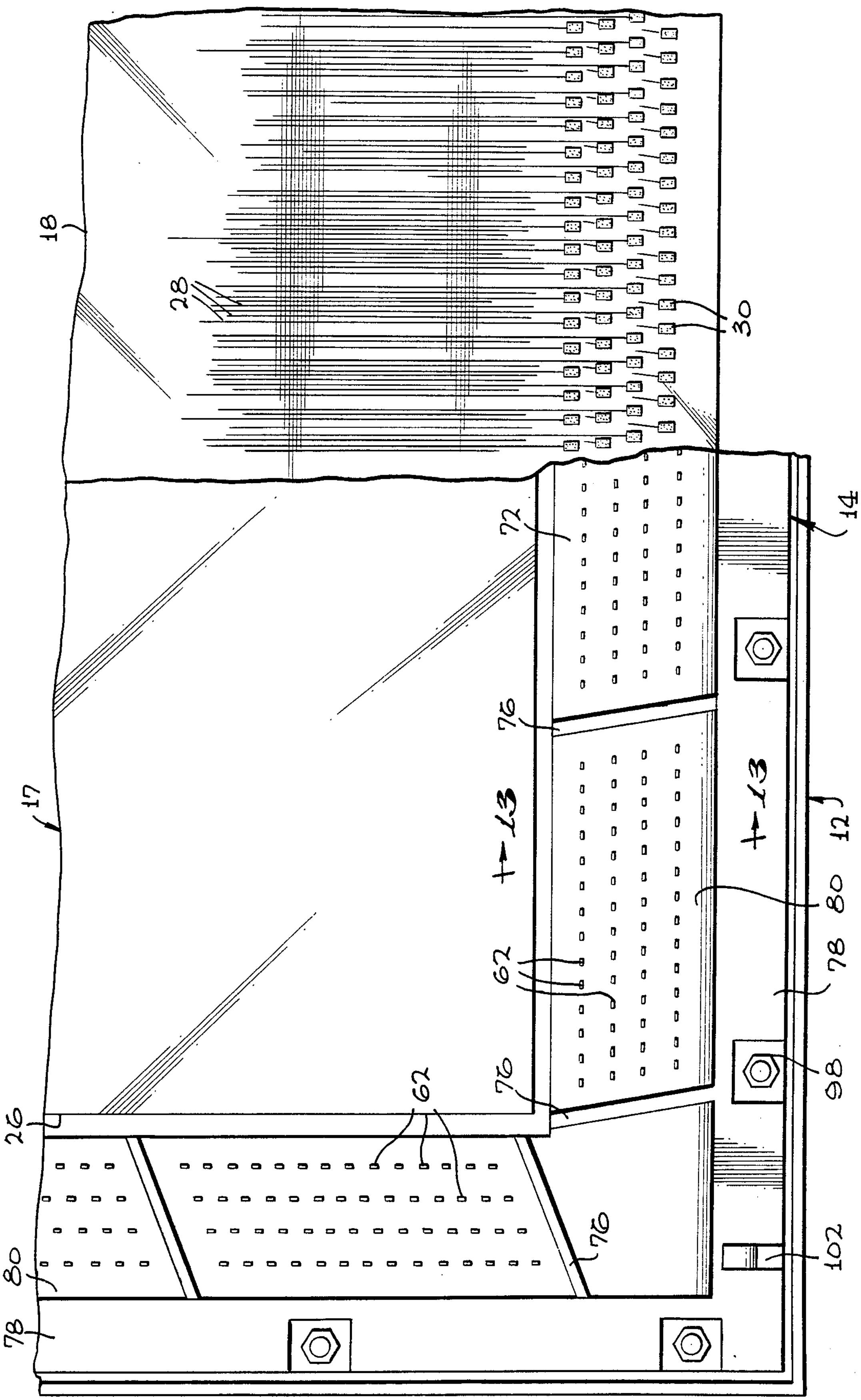
FIG. 12 is a rear detail view of a section of the assembled connector taken in the area designated 12—12 in FIG. 11 partially cut away to show the position of the contact pads on the visual display.

FIG. 11 is a rear view of the assembled connector 10, showing the positions of the ribs 76 along each side of the base 14. FIG. 12 is a rear detail view of a portion of the assembled connector in the area designated 12—12 in FIG. 11 and shows the positions of the terminals 62 which project through the rear surface 72.

Figure 13:
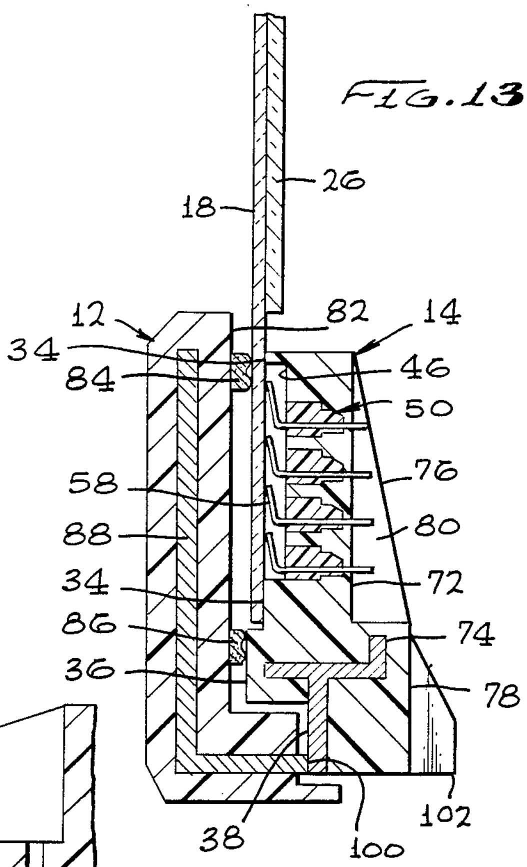
FIG. 13 is an enlarged cross-sectional view of one side of the assembled connector of FIG. 11 taken along the line 13—13 of FIG. 12.

The relative positions of the cover 12, the base 14 and the display 17 in the assembled connector 10 are shown in FIG. 13. The cover 12 has a generally L-shaped cross section and is formed of a moldable insulating material having a low coefficient of thermal expansion, such as phenolic. Affixed to a rear surface 82 of the cover 12 are two resilient seals 84 and 86. The seals 84 and 86 extend around all sides of the cover 12 as shown in FIG. 14. A generally L-shaped cover stiffening bar 88 is molded into each side of the cover 12, and each bar 88 extends substantially the length of the respective side.

One purpose of the bars 88 is to prevent the sides of the cover 12 from bending when the cover 12 is fastened to the base. Accordingly, it is necessary that the material used to make the bars 88 be sufficiently stiff to resist the forces tending to bend the cover 12. In the preferred embodiment, the bars 88 are formed of extruded aluminum. As in the instance of the base stiffening bars 74 described above, it will be appreciated by those skilled in the art that an alternate embodiment of the cover 12 may be constructed in which the four individual bars 88 are replaced by a single rectangular metal frame fashioned of material such as cast aluminum.

The connector 10 of the present invention is assembled in the following manner. The display 17 is placed onto the base 12 with the surface of the substrate 18 bearing the metallization pattern facing the resilient contacts 58. The pads 30 on the substrate 18 are accurately aligned with the contacts 58 when the indexing projections 42 and 44 of the base 14 are engaged within the indexing recesses 20 and 22, respectively, of the substrate 18. This is so because, as described above, the alignment recesses 66 in each cavity 48 are accurately positioned with respect to the indexing projections 42 and 44. In turn, the conductive elements 54 (and hence the contacts 58) are accurately positioned with respect to the alignment bosses 64 on each contact assembly 50. Accordingly, when each assembly 50 is inserted into a respective cavity 48, the bosses 64 cooperate with the recesses 66 to accurately position the contacts 58 with respect to the projections 42 and 44. Since the metallization pattern (and hence the contact pads 30) is applied to the substrate 18 using the recesses 20 and 22 as position alignment references, it can be seen that engaging the projections 42 and 44 within the recesses 20 and 22 results in accurate alignment between the pads 30 and the contacts 58.

The use of multiple cavities 48 in conjunction with multiple contact assemblies 50 in the construction of the connector 10 further assures accurate alignment between the pads 30 and the contacts 58. For instance, one might attempt to construct a connector using a single contact assembly which extends the length of one side of the base and which includes all of the contacts (for example, two hundred fifty six) located along one side of the base. However, due to the long length of each side of the base 14 and the close spacings between contacts 58, it has been found that the accumulation of tolerance errors in the construction of a single long contact assembly produces unacceptable misalignment of the contacts 58. In the connector 10 of the present invention, each contact assembly 50 is only a fraction of the length of any side of the base 14 and contains only sixteen contacts 58. Such an assembly 50 may be constructed having extremely small tolerance errors with respect to the positioning of the individual contacts 58.

In addition to tolerance errors, it is important to consider the effects of thermal expansion of the various elements of the connector 10 on the alignment of the contacts 58. In the present invention, the base 14 is constructed of a thermoset material such as phenolic, having a low coefficient of thermal expansion. Because of the small size of each contact assembly 50, it may be constructed using injection moldable thermoplastics (which generally have higher coefficients of thermal expansion than thermoset materials) without introducing significant alignment errors due to thermal expansion. This mechanization allows the contact assemblies 50 to be inexpensively produced using high speed molding techniques.

Figure 15:
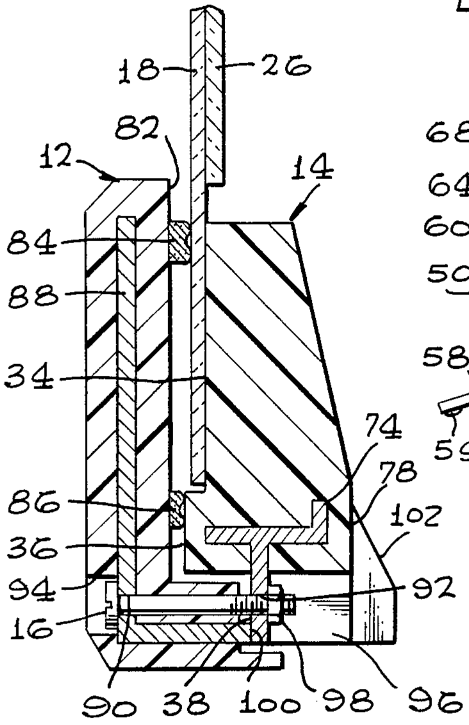
FIG. 15 is an enlarged cross-sectional view of one side of the assembled connector of FIG. 11 taken along the line 15—15 of FIG. 11 showing how the cover portion is fastened to the base portion of the connector.

The cover 12 is placed over the display 17 and is fastened to the base 14 using the metal bolts 16 as shown in FIG. 15. One bolt 16 is inserted through each hole 90 provided in the cover 12 and through a corresponding hole 92 provided in the base 14. The hole 90 passes through the metal bar 88, and the hole 92 passes through the metal bar 74. Openings 94 and 96 are provided in the cover 12 and base 14, respectively, to provide clearance for the head of the bolt 16 and for a nut 98 which is attached to the end of the bolt 16 so that the head of the bolt 16 bears directly on the bar 88 and the nut 98 bears directly on the bar 74.

When the bolts 16 are tightened, a surface 100 of the bar 88 which extends from the body of the cover 12 is caused to bear against the cover mounting platform 38. From the above description, it may be seen that the load bearing surfaces involved in connecting the cover 12 to the base 14 are metal surfaces and do not include any of the phenolic portions of these elements. This fastening technique thus precludes the possibility of distortion of the cover 12 or the base 14 from the forces generated by tightening the bolts 16.

When the bolts 16 are tightened, the resilient seal 84 presses the substrate 18 against the support surface 34 as shown in FIG. 13 and causes the substrate 18 to deflect the contacts 58, which are in the form of cantilevered springs. It will be appreciated that the deflection of the large number of contacts 58 (eleven hundred and fifty two in the preferred embodiment) will result in significant forces being exerted on the cover 12 and the base 14. The cover stiffening bars 88 act to prevent these forces from bending the sides of the cover 12, and the base stiffening bars 74 and ribs 76 act to prevent these forces from bending the sides of the base 14.

Referring to FIG. 15, the seal 86 presses against the front surface of the ridge 36, and acts in cooperation with the seal 84 to protect the pads 30 and the contacts 58 from moisture. Four stand-off projections 102 are provided which extend from the rear surface 78 adjacent the corners of the base 14 as shown in FIGS. 2 and 11. The projections 102 act as spacers to provide clearance behind the connector 10 when it is placed on a mounting surface. The clearance provides space for cables (such as flat ribbon cables) which connect the terminals 62 to external display control equipment.

A preferred embodiment of the connector of the present invention has been described above for making connections to a large area visual display having contact pads arranged along the edges of the substrate. However, the connector of the present invention is by no means limited to this embodiment and may be easily modified to make electrical connection to other types of substrates having different contact pad arrangements.

For example, the connector may be modified to make electrical connections to a large area substrate having a plurality of spaced-apart contact pads arranged in parallel rows and columns which cover substantially the entire area on one surface of the substrate. In such instance, the base of the connector is formed as a solid rectangle instead of as a frame and the multiple rows of cavities are located over substantially the entire area of the base within the support surface.

While the invention is disclosed and particular embodiments thereof are described in detail, it is not intended that the invention be limited solely to these embodiments. Many modifications will occur to those skilled in the art which are within the spirit and scope of the invention. It is thus intended that the invention be limited in scope only by the appended claims.

What is claimed is:

1. An electrical connector for making electrical connections to a generally rectangular large-area substrate having a plurality of spaced-apart contact pads arranged in parallel rows along the edges on one surface of the substrate and positioned with respect to substrate index means provided on a first end of the substrate, comprising:

a base in the form of a generally rectangular frame each side of which includes a support surface for supporting a respective edge on the one surface of the substrate, and having multiple rows of cavities formed below the support surface along each side of the base, each row including a plurality of spaced-apart cavities;

a plurality of generally rectangular contact assemblies, each including an insulator body for supporting multiple spaced-apart electrically conductive elements positioned to form a row of resilient electrical contacts which project from a first surface of the assembly body, and a row of corresponding electrical terminals which project from a second surface of the assembly body, each contact assembly body designed to be removably insertable within a respective one of the cavities so that the electrical contacts extend in multiple rows adjacent the support surface on each side of the base;

alignment means including a contact assembly alignment element formed as part of each contact assembly body and a cavity alignment element formed as part of each cavity for both aligning and retaining each contact assembly in the respective cavity so that the electrical contacts are maintained in aligned relation to the base;

registration means formed as part of the base for positioning the substrate with respect to the electrical contacts so that the substrate contact pads are aligned with the electrical contacts when the substrate is placed onto the base;

a cover in the form of a generally rectangular frame designed to fit over the edges on the other side of the substrate and to fasten to the base, and having means for applying pressure to the edges on the other surface of the substrate to maintain connection between the contact pads and the electrical contacts;

fastening means for fastening the cover to the base; and in which the base further comprises base stiffening means including base stiffening bars, each bar embedded in and extending substantially the length of each side of the base and formed of a material sufficiently stiff to prevent the sides of the base from bending when the cover is fastened to the base.

2. The connector of claim 1 in which each cavity in each row of cavities is offset in position with respect to the cavities in the adjacent row to provide a corresponding staggering of adjacent rows of the electrical contacts when the contact assemblies are inserted within the respective cavities.

3. The connector of claim 1 in which the registration means includes base index means extending above the support surface on a first side of the base and designed to mate with the substrate index means provided on the first end of the substrate; and the cavity alignment element in each cavity is formed in aligned relation to the base index means; and the conductive elements in each contact assembly are positioned in aligned relation to the respective contact assembly alignment element.

4. The connector of claim 1 in which the base further includes multiple support ribs each rib positioned between adjacent cavities in each row of cavities along each side of the base and extending from the support surface to a rear surface of the base to resist forces which act to bend the sides of the base.

5. The connector of claim 4 in which the base further includes multiple recesses formed along the rear of the base, each recess located between adjacent ribs and opposite to and communicating with a respective one of the cavities to receive the electrical terminals projecting from the contact assemblies.

6. The connector of claim 1 in which the cover further comprises cover stiffening means including cover stiffening bars, each bar embedded in and extending substantially the length of each side of the cover and formed of a material of sufficient stiffness to prevent the sides of the cover from bending when the cover is fastended to the base; and in which the fastening means includes means for fastening the cover stiffening bars to the corresponding base stiffening bars.

7. The connector of claim 1 in which the means for applying pressure to the edges of the substrate includes a raised portion extending along the sides of the frame and formed of a generally resilient material.

8. A method of making an electrical connector for making electrical connections to a generally rectangular large-area substrate having a plurality of spaced-apart contact pads arranged in parallel rows along the edges of one surface thereof, comprising the steps of:

forming a base in the shape of a generally rectangular frame each side of which includes a support surface for supporting a respective edge on the one surface of the substrate, and including forming index projections which extend above the support surface on a first side of the base and which are designed to mate with corresponding index recesses provided on a first end of the substrate and with respect to which the contact pads have been positioned, and further including forming multiple rows of cavities, each row including a plurality of spaced-apart cavities, below the support surface along each side of the base, and forming in accurately aligned relation to the index projections a cavity alignment element within each cavity;

forming a plurality of generally rectangular contact assemblies, each having an insulator body designed to be removably insertable within a respective one of the cavities, and including positioning a plurality of spaced-apart, resilient, electrically conductive elements in each assembly body in aligned relation to a contact assembly alignment element formed as part of each assembly body;

shaping the elements to provide a row of resilient electrical contacts which project from a first surface of the assembly body, and to provide a row of corresponding electrical terminals which project from a second surface of the assembly body;

inserting one contact assembly in each cavity so that the electrical contacts extend in multiple rows adjacent the top surface on each side of the base, where each assembly alignment element cooperates with a respective cavity alignment element both to align and retain the assembly in the cavity so that the electrical contacts are aligned with respect to the index projections; and forming a cover in the shape of a generally rectangular frame designed to fit over the edges on the other side of the substrate and to fasten to the base, and including a portion on each side of the cover for applying pressure to the edges on the other surface of the substrate to maintain connection between the contact pads and the electrical contacts when the cover is fastened to the base, and further including the steps of providing base stiffening bars substantially the length of each side of the base and formed of a material sufficiently stiff to prevent the sides of the base from bending when the cover is fastened to the base; and embedding one base stiffening bar in each side of the base so that the bar extends substantially the length of the respective side.

9. The method of claim 8 in which forming multiple rows of cavities further includes offsetting the cavities in each row of cavities with respect of the cavities in the adjacent row to provide a corresponding staggering of adjacent rows of the electrical contacts when the contact assemblies are inserted within the respective cavities.

10. The method of claim 8 in which forming a base further includes forming multiple support ribs therein, each rib positioned between adjacent cavities in each row of cavities along each side of the base and extending from the support surface to a rear surface of the base to resist forces which act to bend the sides of the base.

11. The method of claim 10 in which forming a base further includes forming multiple recesses in the bottom surface thereof, each recess located between adjacent ribs and opposite to and communicating with a respective one of the cavities to receive the electrical terminals projecting from the contact assemblies.

12. The method of claim 8 in which forming a cover further includes:

providing cover stiffening bars substantially the length of each side of the cover and formed of a material sufficiently stiff to prevent the sides of the cover from bending when the cover is fastened to the base; and embedding one cover stiffening bar in each side of the cover so that the bar extends substantially the length of the respective side.

* * * * *